United States Patent
Chui

(10) Patent No.: US 10,018,507 B2
(45) Date of Patent: Jul. 10, 2018

(54) ELECTROMAGNETIC DETECTOR

(71) Applicant: Siu-Tat Chui, Newark, DE (US)

(72) Inventor: Siu-Tat Chui, Newark, DE (US)

(73) Assignee: UNIVERSITY OF DELAWARE, Newark, DE (US)

( * ) Notice: Subject to any disclaimer, the term of this patent is extended or adjusted under 35 U.S.C. 154(b) by 0 days.

(21) Appl. No.: 15/617,548

(22) Filed: Jun. 8, 2017

(65) Prior Publication Data

US 2018/0017439 A1    Jan. 18, 2018

Related U.S. Application Data

(60) Provisional application No. 62/363,397, filed on Jul. 18, 2016.

(51) Int. Cl.
  *G01J 5/02*    (2006.01)
  *G01J 1/44*    (2006.01)
  *G01J 1/42*    (2006.01)

(52) U.S. Cl.
  CPC .............. *G01J 1/44* (2013.01); *G01J 1/4228* (2013.01)

(58) Field of Classification Search
  CPC .......... H03C 7/027; G01J 5/0837; G01J 5/20; G01N 21/3586; H01Q 1/2283; G02F 2203/13
  See application file for complete search history.

(56) References Cited

U.S. PATENT DOCUMENTS

| | | | |
|---|---|---|---|
| 8,957,379 B2* | 2/2015 | Corcos | G01J 5/20 250/341.1 |
| 9,105,791 B1* | 8/2015 | Dyer | H01L 31/1127 |
| 2009/0001980 A1* | 1/2009 | Geren | B82Y 25/00 324/252 |

(Continued)

FOREIGN PATENT DOCUMENTS

JP    2007033160 A  * 2/2007

OTHER PUBLICATIONS

Komandin et al., "Dielectric spectra of Bi0.98Nd0.02 FeO3.00 multiferroic thin films in the Terahertz frequency range," 2010 Physics of the Solid State, vol. 52, No. 9, pp. 1842-1849.*

(Continued)

*Primary Examiner* — Kiho Kim
(74) *Attorney, Agent, or Firm* — RatnerPrestia

(57) ABSTRACT

Electromagnetic detectors and methods for manufacturing electromagnetic detectors are described. The electromagnetic detectors include at least one electromagnetic sensor, where each electromagnetic sensor includes a conductive part having a perimeter, a first connection point on the perimeter of the conductive part, a second connection point on the perimeter of the conductive part, a connection point axis extending between the first and the second connection points, a secondary axis perpendicular to the connection point axis extending through a midpoint between the first and second connection points, the secondary axis dividing the conductive part into two portions that are asymmetrical to one another. The electromagnetic detector also includes a voltage detector coupled to the first and the second connection points to detect voltages produced by the conductive part when exposed to electromagnetic waves.

15 Claims, 3 Drawing Sheets

(56) References Cited

U.S. PATENT DOCUMENTS

| | | | | |
|---|---|---|---|---|
| 2009/0262766 | A1* | 10/2009 | Chen | H03C 7/027 |
| | | | | 372/26 |
| 2014/0061469 | A1* | 3/2014 | Hwang | G01J 5/28 |
| | | | | 250/338.4 |
| 2014/0124885 | A1* | 5/2014 | Sekiguchi | H01L 29/872 |
| | | | | 257/428 |
| 2014/0231648 | A1* | 8/2014 | Kotter | G01J 3/42 |
| | | | | 250/339.02 |
| 2014/0264029 | A1* | 9/2014 | Tomioka | G01J 3/42 |
| | | | | 250/338.3 |
| 2014/0267757 | A1* | 9/2014 | Abramson | H04N 5/23216 |
| | | | | 348/164 |
| 2015/0123741 | A1* | 5/2015 | Koyama | H03B 7/08 |
| | | | | 331/107 T |

OTHER PUBLICATIONS

XueHui et al., "Nb5N6 thin film on silicon and silicon oxide: a good material for terahertz detection," 2009, Chinese Science Bulletin, Brief Communication, pp. 3344-3356.*

Chui et al., "Electromagnetic sensors from algebraic corner vortex generation in polygonal plates," Applied Physics Letters 110, 011107 (2017), 5 pages.

Chui et al., "Scattering of electromagnetic waves from surfaces with conformal mapping: An example of a triangular plate," Physical Review E 93, 033302 (2016), 10 pages.

Jackson, "Chapter 10 Magnetohydrodynamics and Plasma Physics," Classical Electrodynamics, John Wiley & Sons, Inc. 1962, pp. 309-346.

Shen, "Maxwell's Equations in Nonlinear Media," Principles of nonlinear optics, Wiley, New York (1984), pp. 1-12.

Costache et al., "Electrical Detection of Spin Pumping due to the Precessing Magnetization of a Single Ferromagnet," Physical Review Letters 97, 216603, Nov. 24, 2006, 4 pages.

Moriyama et al., "Tunnel barrier enhanced voltage signals generated by magnetization precession of a single ferromagnetic layer," Physical Review Letters 100, 067602 (2008), 16 pages.

Chui et al., "Large voltage from spin pumping in magnetic tunnel junctions," Physical Review Letters B 77, 094432 (2008), 14 pages.

Heinrich et al., "Spin Pumping at the Magnetic Insulator (YIG)/Normal Metal (Au) Interfaces," Physical Review Letters 107, 066604, Aug. 5, 2011, 4 pages.

Burrowes et al., "Enhanced spin pumping at yttrium iron garnet/Au interfaces," Applied Physics Letters 100, 092403 (2012), 4 pages.

Sandweg et al., "Spin Pumping by Parametrically Excited Exchange Magnons," Physical Review Letters 106, 216601, May 27, 2011, 4 pages.

Chui et al., "Nonlocal optical generation of spin and charge currents on the surface of magnetic insulators using total absorption and surface plasmons," Journal of Applied Physics 113, 233901 (2013), 6 pages.

Hatano et al., "Transverse Photovoltage Induced by Circularly Polarized Light," Physical Review Letters 103, 103906, Sep. 4, 2009, 4 pages.

Bai et al., "Polarization dependence of photo-rectification in metasurfaces with asymetric unit cell," Symmetry breaking due to triangular shape presented at PECS IX, Shanghai, May 2014, 16 pages.

Chui et al., "Chapter 1 Resonance properties of metallic ring systems—a single ring," Electromagnetic behaviour of metallic wire structures, Springer (2013), 26 pages.

Zhan et al., "Multiple scattering of metallic wire structures," Journal of Applied Physics 118, 163104 (2015), 6 pages.

Chui et al., "Resonances and circuit theory for the interaction of metallic disks and annuli with an electromagnetic field," Physical Review E 90, 053202 (2014), 8 pages.

Hagemann et al., "Optical Constants from the Far Infrared to the X-Ray Region: Mg, Al, Cu, Ag, Au, Bi, C, and Al203," DESY Report SR-74/7, May 1974, 96 pages.

Zhan et al., "t matrix of metallic wire structures," Journal of Applied Physics 115, 144901 (2014), 6 pages.

Woods, "Solvent-induced backbone fluctuations and the collective librational dynamics of lysozyme studied by terahertz spectroscopy," Physical Review E 81, 031915 (2010), 15 pages.

Cote et al., "THz emission from coherently controlled photocurrents in GaAs," Applied Physics Letters, vol. 75, No. 25, Dec. 20, 1999, pp. 3959-3961.

Beard et al., "Terahertz Spectroscopy," J. Phys. Chem. B 2002, 106, pp. 7146-7159.

Wu et al., "Free-space electro-optic sampling of terahertz beams," Applied Physics Letters 67 (24), Dec. 11, 1995, pp. 3523-3525.

Nahata et al., "Coherent detection of freely propagating terahertz radiation by electro-optic sampling," Applied Physics Letters 68 (2), Jan. 8, 1996, pp. 150-152.

Chen et al., "Retrieval of terahertz spectra through ultrafast electro-optic modulation," Applied Physics Letters 99, 011106 (2011), 3 pages.

Chen et al., "High wavevector optical phonons in microstructured Bismuth films," Optics Express, vol. 18, No. 5, Mar. 1, 2010, pp. 4365-4370.

Weling et al., "Novel sources and detectors for coherent tunable narrow-band terahertz radiation in free space," J. Opt. Soc. Am. B, vol. 13, No. 12, Dec. 1996, pp. 2783-2791.

You et al., "Generation of high-power sub-single-cycle 500-fs electromagnetic pulses," Optics Letters, vol. 18, No. 4, Feb. 15, 1993, pp. 290-292.

Oh et al., "Intense terahertz generation in two-color laser filamentation: energy scaling with terawatt laser systems," New Journal of Physics, 15 (2013), 17 pages.

Xie et al., "Coherent Control of THz Wave Generation in Ambient Air," Physical Review Letters 96, 075005, Feb. 24, 2006, 4 pages.

Yokota et al., "Surface metallic states in ultrathin Bi(001) films studied with terahertz time-domain spectroscopy," Applied Physics Letters 100, 251605 (2012), 4 pages.

Van De Hulst, "Light Scattering by Small Particles—Chapter 15 Circular Cylinders," Dover 1957 (New York), pp. 297-328.

* cited by examiner

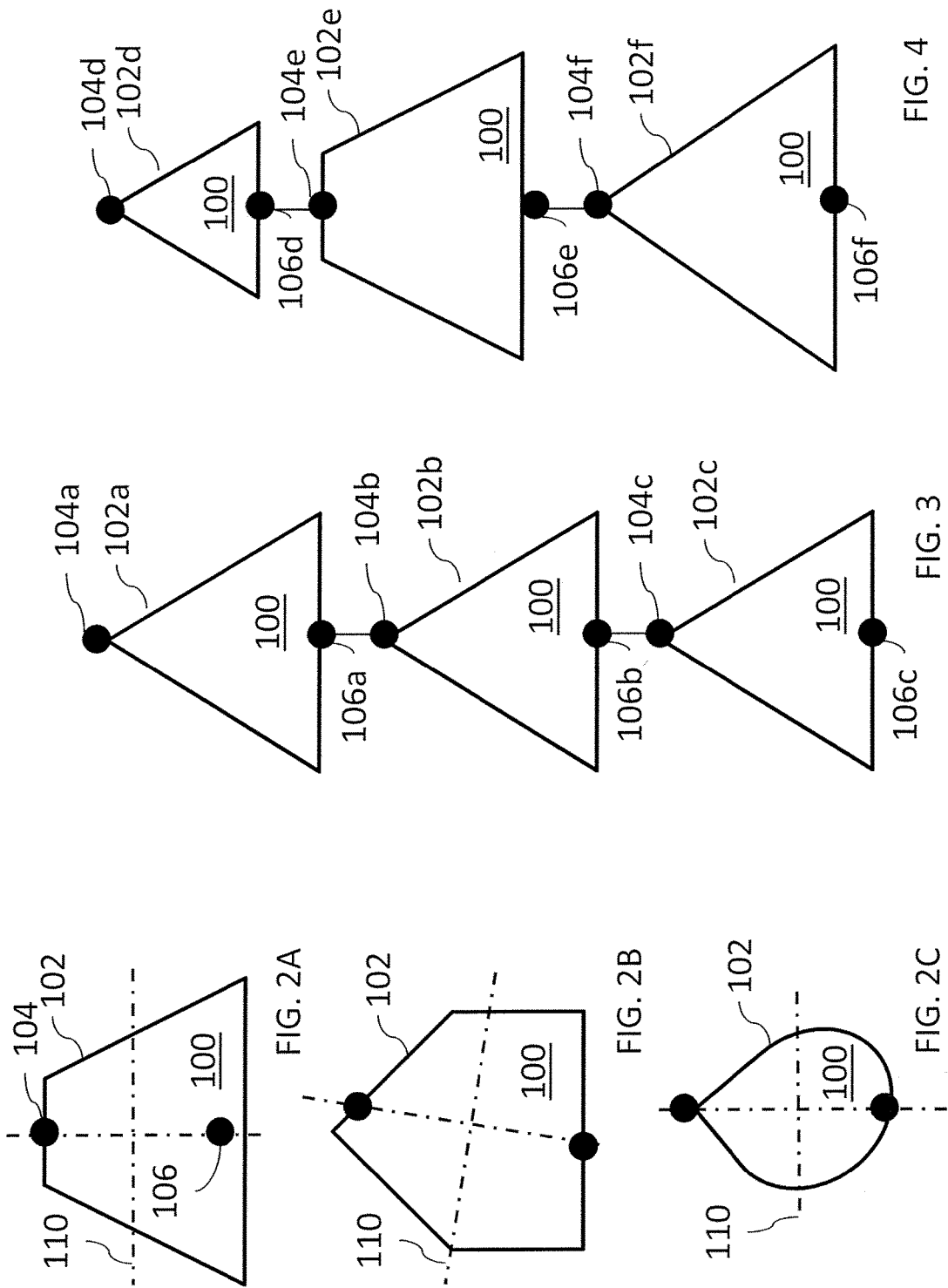

ELECTROMAGNETIC DETECTOR

CROSS-REFERENCE TO RELATED APPLICATION

This application claims priority to U.S. Provisional Application Ser. No. 62/363,397 entitled A VERY SIMPLE ELECTROMAGNETIC DETECTOR, filed on Jul. 18, 2017, the contents of which are incorporated fully herein by reference.

FEDERALLY SPONSORED RESEARCH STATEMENT

This invention was not made with government support. The government has no rights in this invention.

FIELD OF THE INVENTION

The invention relates to electromagnetic detectors and more particularly to electromagnetic detectors that are asymmetric about an axis extending through contact points on a perimeter of the detector.

BACKGROUND OF THE INVENTION

In the last several decades, the rapid development and commercialization of wireless technology has fundamentally changed society. From the development of smart devices to driver-less transportation, this wireless revolution has changed how one interacts with their environment. With an ever growing set of devices that utilize wireless communication, there is a need for low-cost electromagnetic (EM) radiation sensors.

Conventional millimeter (mm) and sub mm wavelength detection technology (e.g. very small band gap semiconductors and/or cryogenically cooled detectors) are too expensive to be commercially developed for the standard consumer.

In most methods of detecting optical EM radiation, the photoconductive response of a semi-conductor is often used, e.g., silicon based photo-receivers. While useful in the optical regime, due to the low photon energy of mid to far-infrared radiation, other materials must be sought out. For mid-infrared detection ($\lambda$=3-8 µm) mercury cadmium telluride (MCT) detectors have become widely used, however their sensitivity dramatically decreases as one increases the EM wavelength. In addition, both single and multi-channel MCT detectors can be very expensive (greater and $2,000 and $50,000, respectively) and require complex control circuitry for bias and readout.

For radiation wavelengths that exceed 10 µm, cryogenically cooled detectors such as liquid helium cooled silicon bolometers are used. While efficient, the size (approximately the size of a toaster oven) and cost (greater than $30,000) of the single channel bolometers makes them impractical for many field and/or clinical applications. In addition, making these devices into multi-dimensional arrays for imaging is very challenging and cost-prohibitive.

Recent alternatives to direct detection methods include optical based THz spectroscopy methods. In these method free space electro-optic sampling (FSEOS) or optical gating of a photoconductive switches are typically used. FSEOS converts the temporal signature of THz radiation to the visible portion of the electromagnetic spectrum, thereby allowing optical detection technologies to measure the amplitude and phase of coherent THz radiation. Optical gating of photoconductive switches utilizes the transient electric field of the THz radiation to drive a current in optically excited semi-conductor. However, as the time-integrated electric field of the EM wave is still zero, this device requires the use of an ultrafast optical source to temporally gate the signal to determine the magnitude and direction the propagating wave.

There is a need for EM sensors that are smaller and more cost-effective than conventional sensors such as those described above. The invention addresses these needs among others.

SUMMARY OF THE INVENTION

Aspects of the invention are embodied in electromagnetic detectors and methods for manufacturing electromagnetic detectors. The electromagnetic detectors include at least one electromagnetic sensor, where each electromagnetic sensor includes a conductive part having a perimeter, a first connection point on the perimeter of the conductive part, a second connection point on the perimeter of the conductive part, a connection point axis extending between the first and the second connection points, a secondary axis perpendicular to the connection point axis extending through a midpoint between the first and second connection points, the secondary axis dividing the conductive part into two portions that are asymmetrical to one another. The electromagnetic detector also includes a voltage detector coupled to the first and the second connection points to detect voltages produced by the conductive part when exposed to electromagnetic waves.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures:

FIG. 2A is a block diagram of an electromagnetic sensor in accordance with aspects of the invention;

FIG. 2B is a block diagram of another electromagnetic sensor in accordance with aspects of the invention;

FIG. 2C is a block diagram of another electromagnetic sensor in accordance with aspects of the invention;

FIG. 3 is a block diagram of a chain of electromagnetic sensors in accordance with aspects of the invention;

FIG. 4 is a block diagram of another chain of electromagnetic sensors in accordance with aspects of the invention;

DETAILED DESCRIPTION OF THE INVENTION

Figure 1:
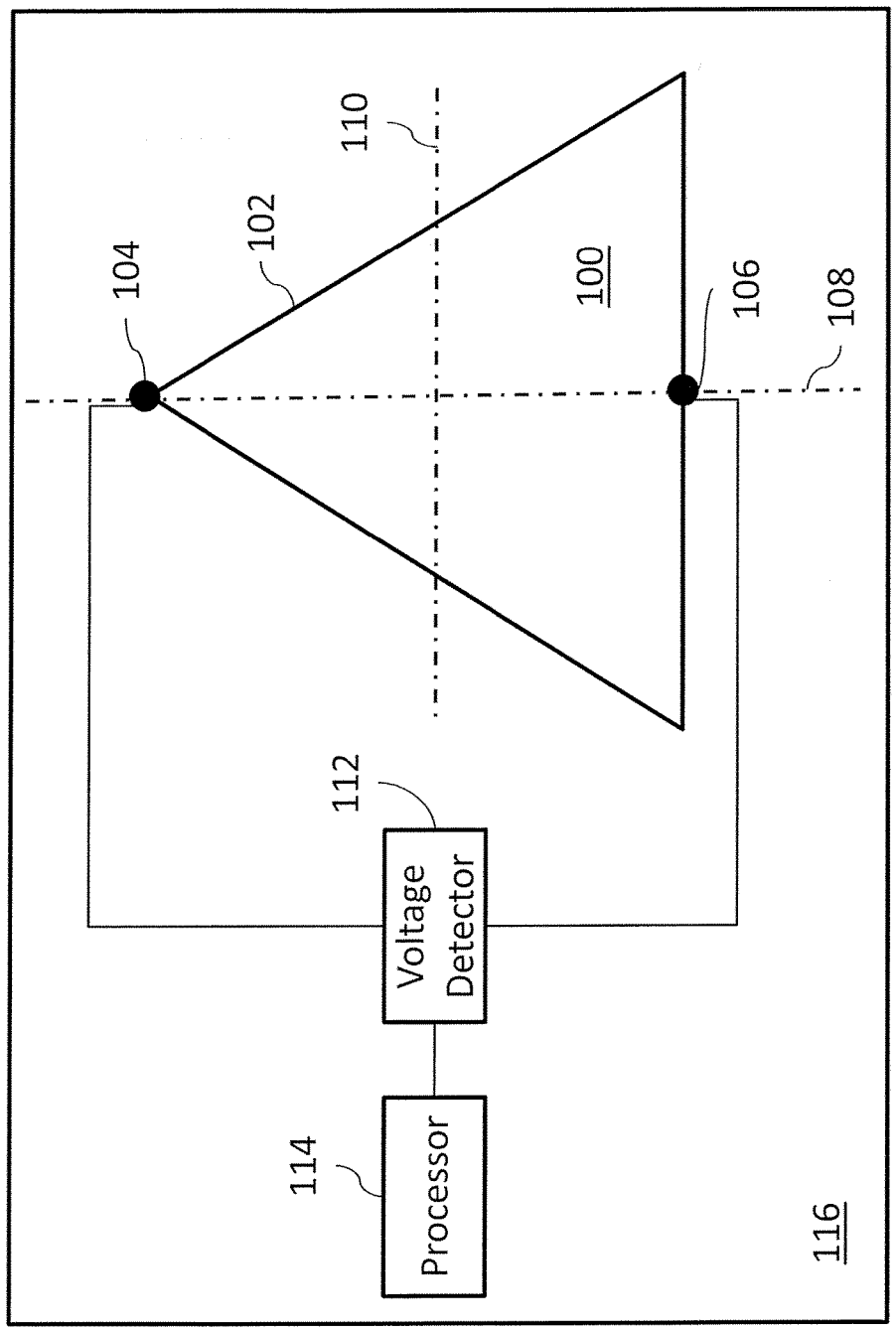
FIG. 1 is a block diagram of an electromagnetic detector in accordance with aspects of the invention.

FIG. 1 depicts an electromagnetic detector in accordance with one embodiment of the invention. The illustrated electromagnetic detector includes an electromagnetic sensor 100 and a voltage detector 112. The voltage detector 112 detects voltages produced by the electromagnetic sensor 100. The illustrated electromagnetic detector also includes a processor 114 that detects voltages produced by the voltage detector. The processor 114 may be separate from the voltage detector 112 or may be incorporated into the voltage detector 112. Suitable voltage detectors 112 and processors 114 will be understood by one of skill in the art from the description herein.

Because of its extreme simplicity in design and manufacture, these sensors such as depicted in FIG. 1 can be much more cost effective than current sensors, providing a viable alternative to conventional EM radiation detection devices. Static voltages may be induced in a triangular metallic plate through the illumination of an EM radiation field. The induced voltage provides the basis for a highly sensitive/low-cost EM radiation detector. While the design is scalable to all EM frequencies, aspect of the inventive sensor are particularly advantageous to applications in the millimeter (mm) and sub mm wavelength region, which have significant security and communication applications. Additionally, while the detection sensitivity to EM radiation may be competitive with conventional technologies, the construction and implementation is much simpler to make and maintain and can be directly integrated into existing devices with little or no modification.

In one embodiment, all the components of the electromagnetic detector may all be formed on a substrate 116 such as a semiconductor or insulator substrate. Suitable substrates will be understood by one of skill in the art from the description herein.

In another embodiment one or more of the components may be formed on separate substrates or a stand-alone components. For example, the electromagnetic sensor 100 and the voltage detector 112 may be formed on a common substrate and the processor 114 may be a separate stand-alone component that receives signals from the voltage detector.

The electromagnetic sensor includes a conductive part 100 having a perimeter 102. The conductive part may be a film or sheet of conductive material formed on a substrate 116. The conductive material may be bismuth or other material having a relatively large Hall coefficient (e.g., greater than $10^{16}$ m$^3$/coulomb). The size and shape of the perimeter 102 of the electromagnetic sensor is selected to sense particular wavelengths/frequencies of electromagnetic waves. Additional details regarding the selection of the size and shape of the perimeter 102 is set forth below.

The perimeter 102 of the illustrated electromagnetic sensor is an equilateral triangle having three vertices connected by three legs. In an embodiment, the perimeter at the vertices has a relatively sharp angle (the signal may become smaller as the corners get more rounded). Without being limited to any particular theory, as current goes into a corner of the perimeter 102 it has to turn and corner vortices are created. The EM filed injects static voltage through these corner "fractional vortices," which are made finite for a triangular perimeter by a "branch cut" behavior. A first connection point 104 is arranged at one of the vertices and a second connection point 106 is arranged on a leg of the perimeter 102 opposite connection point 104 at a midpoint between the other two vertices.

A connection point axis 108 extends through the conductive part 100 between the first connection point 104 and the second connection point 106. The connection point axis 108 divides the conductive part 100 illustrated in FIG. 1 into portions that are symmetric with one another.

A secondary axis 110 extends through the conductive part 100 and bisects the connection point axis 108 at a midpoint between the first and second connection points. The illustrated secondary axis 110 is perpendicular to the connection point axis 108. The secondary axis 110 divides the conductive part 100 into two portions that are asymmetrical to one another The voltage detector 112 is coupled to the first connection point 104 and the second connection point 106. The voltage detector 112 may be coupled to the connection points 104/106 with conductive traces formed on the substrate 116. The processor 114 is coupled to the voltage detector 112. The processor 114 may be coupled to the voltage detector 114 with conductive traces formed on the substrate.

In use, electromagnetic waves impinging on the conductive part 100 produce a voltage differential between the first connection point 104 and the second connection point 106 that is proportional to the magnitude of the impinging electromagnetic waves. The voltage detector 112 coupled to the first connection point 104 and the second connection point detects the voltage differential and produces a signal that is processed by processor 114 to provide a human readable value that corresponds to the magnitude of the impinging electromagnetic waves.

FIGS. 2A-2C depict alternative electromagnetic sensors having three different shaped perimeters 102. The electromagnetic sensor in FIG. 2A is a truncated isosceles triangle, in FIG. 2B is a pentagon, in FIG. 2C is a droplet. The electromagnetic sensor can have essentially any shape as long as the shape is asymmetrical about the secondary axis 110. The connections points 104/106 are near the perimeters 102 of the electromagnetic sensors. As illustrated in FIG. 2A, the connection points can be positioned on the perimeter (connections point 104) or near the perimeter (connection point 106).

As illustrated in FIGS. 3 and 4, multiple electromagnetic sensors may be interconnected to improve performance (e.g., sensitivity or granularity). The electromagnetic sensors may be interconnected by connecting a first connection point 104 of one electromagnetic sensor to a second connection point 106 of another sensor. The electromagnetic sensors may be interconnected with a trace extending between the connection points of the electromagnetic sensors; or by having the connection points overlap or having a single connection point serve as both a first connection point 104 of one electromagnetic sensor and a second connection point 106 of another sensor.

If electromagnetic sensors having a perimeter 102 of the same size and shape are used, such as perimeters 102a-c depicted in FIG. 3, sensitivity to particular wavelengths/frequencies is improved. In accordance with this embodiment, the electromagnetic sensors are coupled in series with a voltage detector 112 coupled to a first connection point 104a of a first electromagnetic sensor in the chain and to a second connection point 106c of a last electromagnetic sensor in the chain.

If electromagnetic sensors having a perimeter 102 of different sizes and shapes are used, such as perimeters 102d-f depicted in FIG. 4, granularity with respect to different wavelengths/frequencies is improved. In accordance with this embodiment, the electromagnetic sensors are coupled in series with a voltage detector 112 coupled to a first connection point 104d of a first electromagnetic sensor in the chain and to a second connection point 106f of a last electromagnetic sensor in the chain. Voltage detector 112 may additionally be connected to intermediate points in the chain, e.g., to connection points 106*d*/104*e* and/or connection points 106*e*/104*f*, for further improvements in granularity.

Figure 5:
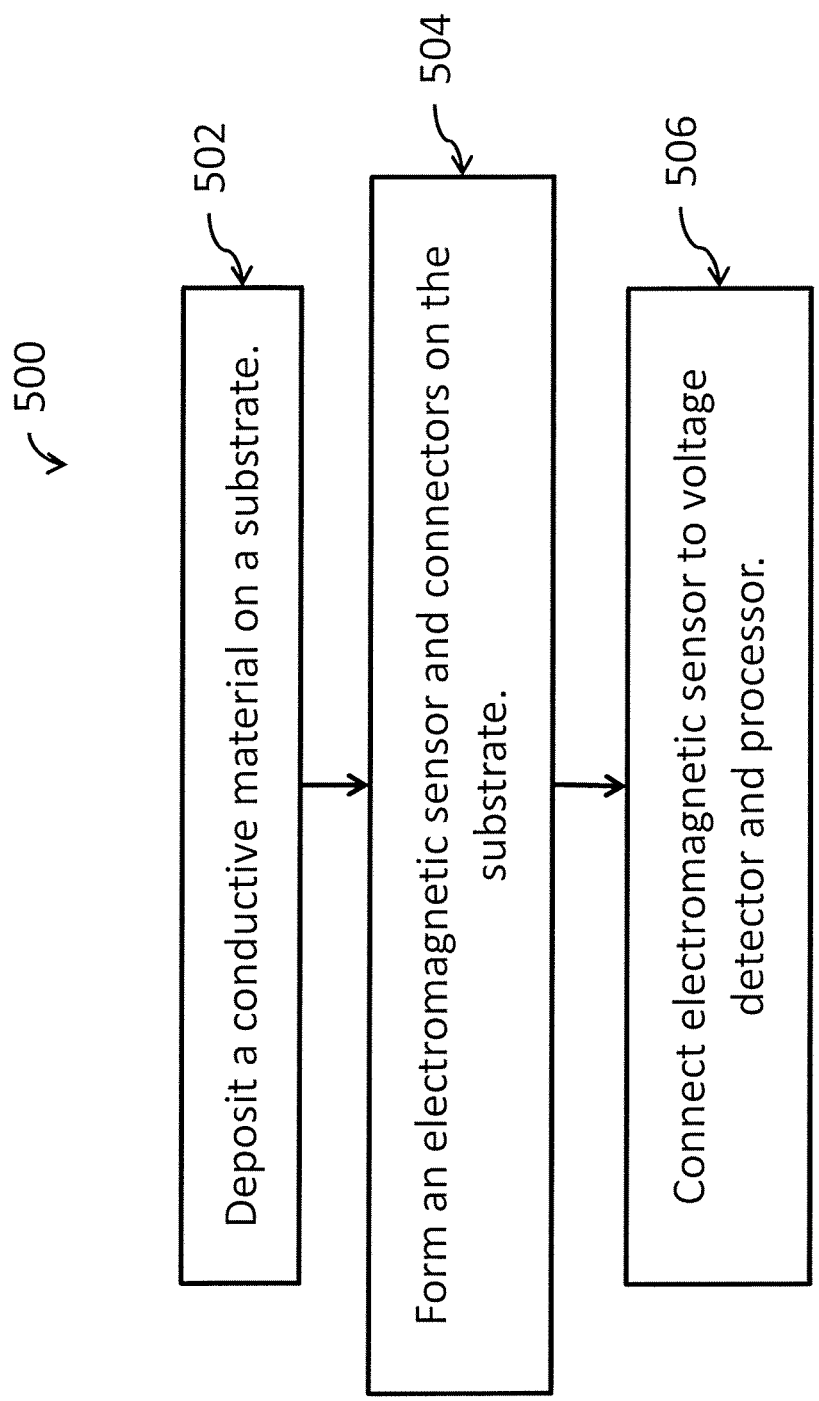
FIG. 5 is a flow chart of steps for producing an electromagnetic detector in accordance with aspects of the invention.

FIG. 5 depicts a flow chart 500 of steps for producing an electromagnetic detector in accordance with aspects of the invention. The steps are described below with reference to the electromagnetic detector and components described above with reference to FIGS. 1-4 for ease of description.

At step 502, a conductive material is deposited on a substrate. The conductive material may be bismuth or another conductive material with a relatively large Hall coefficient. The conductive material may be deposited on a semiconductor or insulator substrate using conventional deposition techniques.

At step 504, the electromagnetic sensors and connectors are formed. The electromagnetic sensors and connectors may be formed by etching the deposited conductive materials around the perimeters of each sensor and around where the interconnecting traces are to be positioned. Standard optical photo-lithography techniques may be used in conjunction with molecular evaporation to form the sensors and connectors.

At a first resonance, the length of the sides of, for example, a triangle, is approximately equal to 0.4 times the wavelength $\lambda$. A series of triangular geometries, with lateral dimensions on order of 1 mm, easily obtainable with standard optical patterning. Bismuth films that are approximately 100 nm thick may be deposited directly on standard silicon substrates. In such a geometry, a significant fraction of the far-infrared radiation is absorbed in the bismuth film, which increases the potential electrical response upon illumination.

At step 506, the formed electromagnetic sensors are coupled to a voltage detector and a processor.

The films may be produced using lithographic techniques to from a thin metallic film. A metal with a large figure of merit is desirable. The figure of merit is the ratio of the Hall coefficient $R_H$ divided by the resistivity $\rho$. An example of such a material is Bismuth, which has a Hall coefficient 6000 times that of Copper. Such films can be made by techniques such as sputtering, chemical vapor deposition or molecular beam epitaxy. The thickness of the film is desirably less than or equal to the skin depth at the frequency of interest in sensing. This is because the electromagnetic signal can only penetrate up to this distance and the extra material will be wasted for thicker films. Typical thickness can be of the order of 10 nm for infrared frequencies. For applications at angular frequency $\omega$, the optimum size of an equilateral triangle with base length a is such that $\omega a/c \sim 3$ where c is the speed of light.

An array of triangles may be created from the film and the patterning of the array can be done with conventional lithographical techniques. The arrays may include different patterns of the triangles of different sizes and/or orientations, depending on the frequency range and the polarization of the application. Typical patterns are periodic arrays that form triangular, square, rectangular or hexagonal lattices. There can be triangles of different sizes and orientations inside each unit cell of the lattice. The power of the incoming electromagnetic wave is measured as a voltage between a tip of the triangle and the middle of the base opposite to it. Some of the triangles in a unit cell can also be connected by thin metallic connects. In this case, the voltage across the small chain of the triangles in series is enhanced relative to the noise.

The sensor need not be exactly triangular in shape. In general, the perimeter of the figure can be described by its distance r at azimuthal angle $\varphi$. Thus a circle is described by the trajectory $r(\varphi)$=constant. For any general shape, we can write $r(\varphi)$ as a Fourier series so that $r(\varphi) \Sigma_m r_m e^{im\varphi}$. Any shape that possesses a triangular "component" $r_3 \approx 0$ will also produce a finite voltage.

These arrays of triangles can be used in devices that require the sensing of objects. Examples of possible uses are: cameras to capture images, in smart cars to sense other nearby objects or in remote controls.

Without being limited to any particular theory, the physics behind the operation of the electromagnetic sensor is now provided. When an external linearly polarized EM wave is incident on the metallic triangular film, currents are induced. Near the frequency with $\omega a/c \sim 3$ the induced current flow creates a magnetic field in a direction perpendicular to the film. Through the Hall effect, the current and the magnetic field together induce a spatially varying static electric field. For an incoming linearly polarized EM wave, the average voltage across the triangle in the direction of the connection point axis 108 (y) is nonzero. For an incoming circularly polarized EM wave, the average voltage across an equilateral triangle in the direction of the connection point axis 108 is zero.

For a linearly polarized external EM field, the current j induced in the sensor will have the form:

$$j = \Sigma_n r_n \Sigma_m e^{imn\varphi}[A_m e_- \exp(2i\varphi) + B_m e_+] + \text{complex conjugate}$$

Here n, m are integers and $e_\pm = (e_x \pm i e_y)/\sqrt{2}$ are circularly polarized unit vectors. The corresponding component of the magnetic field perpendicular to the film will have the form $B = \Sigma_n r_n \Sigma_m e^{imn\varphi} C_m e_z \exp(i\varphi)$+complex conjugate. The Hall electric field is proportional to the cross product j×B. Its spatial dependence contains terms of the form $r_n \Sigma_m e^{imn\varphi} \exp(3i\varphi)$. The average of this field over the angle $\varphi$ is finite if the senor perimeter contains a triangular component with n=3 for m=−1.

The static voltages produced by sensors such as those described herein enable these sensors to be used as a simple sensor of EM waves. An estimate of the order of magnitude of the sensitivity of an equilateral triangle is now provided. The conventional figure of merit is the noise equivalent power (NEP), the absorbed power required to get a signal the same order of magnitude as the noise. For a sensor of thickness t the NEP scales as $t^{3/2}$ and can be made essentially as small as desired, limited by current fabrication precision. More precisely, the static electric field is of the order of magnitude:

$$E_H = \beta R_H j B = \beta (R_H/\rho_0) EB$$

where $\beta$ is −0.03. For a sensor of linear dimension a and thickness t the power absorbed is Pat with:

$$P = EB/\mu_0 \approx E^2 a/\rho_0$$

and the Johnson noise N is:

$$N = 0.13\sqrt{Rn} V/\sqrt{Hz}$$

at room temperature where R, of the order of $\rho_0 t$, is the resistance in units of Ohm. Thus, N is proportional to $t^{1/2}$. Now the voltage is $V_H = E_H a$. The noise equivalent power (NEP) of the sensor:

$$NEP = (Pat)N/V_H = \rho_0 tN/(\beta\mu_0 R_H),$$

scales with $t^{3/2}$ and thus can be made as small as desired, limited by current fabrication precision.

In the free electron approximation, $1/\rho$ exhibits a frequency dependence that is of a Drude form whereas RH is frequency independent.

Another figure of merit (NEIP) is used to normalize the voltage with respect to the incoming power and not the absorbed power. For ordinary sensors which are usually operated off resonance, the power absorbed P' at is much less than that of the incoming power:

$$P'(R/Z_0)^2 P \approx 10^{-6} P$$

for a resistance $R=0.1\Omega$ and the permitivity of the vacuum $Z_0=377\Omega$. For the triangular sensor at resonance the power absorbed is of the same order of magnitude as the incoming power. If t is taken to be of the order of the 0.1 μm, NEIP$\approx 10^{-12}$ W/$\sqrt{Hz}$, which is two orders of magnitude smaller than that of existing sensors if one uses a large RH metal such as Bismuth. Relative to the power flux, $V_H/P \approx 0.01$V/MW-cm$^{-2}$. This estimate for the inventive sensor is two orders of magnitude larger than the value of 0.1 mV/MW-cm$^{-2}$ obtained for two dimensional photonic crystals, but is easier to make, has a faster response time, and does not require refrigeration.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An electromagnetic wave detector comprising:
   at least one electromagnetic sensor, each electromagnetic sensor including:
   a conductive part having a perimeter;
   a first connection point on the perimeter of the conductive part;
   a second connection point on the perimeter of the conductive part;
   a connection point axis extending between the first and the second connection points;
   a secondary axis perpendicular to the connection point axis extending through a midpoint between the first and second connection points, the secondary axis dividing the conductive part into two portions that are asymmetrical to one another, the secondary axis set to produce Hall Effect voltages across the conductive part in response to electromagnetic waves; and
   a voltage detector coupled to the first and the second connection points to detect the Hall Effect voltages produced by the conductive part when exposed to the electromagnetic waves.

2. The detector of claim 1, further comprising:
   a substrate on which the conductive part is supported.

3. The detector of claim 2, wherein the substrate is a semiconductor.

4. The detector of claim 2, wherein the substrate is an insulator.

5. The detector of claim 1, further comprising:
   a processor coupled to the voltage detector, the processor configured to interpret the voltages detected by the voltage detector.

6. The detector of claim 1, wherein the perimeter of the conductive part is a triangle.

7. The detector of claim 1, wherein the second connection point is opposite the first connection point on the perimeter of the conductive part.

8. The detector of claim 1, wherein the connection point axis divides the conductive part into two portions that are symmetrical to one another.

9. The detector of claim 1, wherein the at least one electromagnetic sensor includes at least two electromagnetic sensors connected in series.

10. The detector of claim 1, wherein the at least one electromagnetic sensor includes at least two electromagnetic sensors, each of the at least two electromagnetic sensors having a different perimeter.

11. The detector of claim 10, wherein the perimeter of each of the at least two electromagnetic sensors having a different length.

12. The detector of claim 10, wherein the perimeter of each of the at least two electromagnetic sensors having a different shape.

13. The detector of claim 1, wherein the conductive part comprises bismuth.

14. The detector of claim 1, wherein the conductive part comprises a metal with a large Hall coefficient.

15. A method for forming an electromagnetic detector comprising:
   depositing a conductive material on a substrate;
   forming an electromagnetic sensor as described in claim 1 from the deposited conductive material; and
   coupling the formed electromagnetic sensor to a voltage detector.

* * * * *